United States Patent [19]
Bloker

[11] Patent Number: 5,469,084
[45] Date of Patent: * Nov. 21, 1995

[54] BICMOS OUTPUT DRIVER

[75] Inventor: Raymond E. Bloker, San Jose, Calif.

[73] Assignee: Cypress Semiconductor Corp., San Jose, Calif.

[*] Notice: The portion of the term of this patent subsequent to Nov. 8, 2011, has been disclaimed.

[21] Appl. No.: 279,495

[22] Filed: Jul. 22, 1994

Related U.S. Application Data

[63] Continuation of Ser. No. 991,568, Dec. 16, 1992, Pat. No. 5,362,997.

[51] Int. Cl.$^6$ .................................................. H03K 19/08
[52] U.S. Cl. ............................ 326/110; 326/84; 326/109
[58] Field of Search ................................. 326/109, 110, 326/27, 84

[56] References Cited

U.S. PATENT DOCUMENTS

| | | | |
|---|---|---|---|
| 4,301,383 | 10/1979 | Taylor | 307/446 |
| 5,140,190 | 5/1991 | Yoo et al. | 307/446 |
| 5,146,118 | 2/1991 | Nakamura et al. | 307/446 |
| 5,362,997 | 11/1994 | Bloker | 326/64 |

Primary Examiner—Edward P. Westin
Assistant Examiner—Andrew Sanders
Attorney, Agent, or Firm—Blakely, Sokoloff, Taylor & Zafman

[57] ABSTRACT

A novel, high-performance BiCMOS Output Driver. The Output Driver comprises a first pull-up means for pulling high the output of the Output Driver and a pull-down means for pulling low the output of the Output Driver. The first pull-up means includes a bipolar transistor. Coupled in parallel with the first pull-up means is a MOS transistor wherein the gate of the MOS transistor is electrically isolated from the base of the bipolar transistor.

11 Claims, 8 Drawing Sheets

BICMOS OUTPUT DRIVER

This is a continuation of application Ser. No. 07/991,568, filed Dec. 16, 1992, now U.S. Pat. No. 5,362,997.

BACKGROUND OF THE INVENTION

1. Field of the Invention

The present invention relates to the field of semiconductor circuits, and more specifically, to the field of BiCMOS Output Drivers.

2. Description of Related Art

Output Drivers are well-known in the art. Output Drivers are used to drive a predetermined logic signal (i.e. logical high or logical low) out across a signal line to other chips or to other circuits on chip. Output Drivers "drive" the logical signal to other circuits by increasing (amplifying) the current of the signal supplied to the driver. It is important that the output voltage level of an Output Driver meet specified data sheet requirements. For example, TTL level Output Drivers must supply a voltage level of greater than 2.4 volts for a logical high signal and supply a voltage level of less than 0.4 volts for a logical low signal. It is also important that an Output Driver be able to meet data sheet voltage level requirements over a wide range of operating temperatures, typically between −55° C. to 125° C. The performance of an Output Driver can be approximated by the driver's ratio of Drive Capability/Input Capacitance. The larger the ratio, the better performing the Output Driver.

FIG. 1 shows an all NMOS Output Driver 100. The Output Driver 100 comprises an NMOS pull-up transistor 112 and an NMOS pull-down transistor 114. A problem with the Output Driver 100 of FIG. 1 is the NMOS pull-up transistor 112. NMOS transistors typically have a low Drive/Input Capacitance ratio. In order to provide sufficient drive capability, the NMOS transistor 112 must be relatively large, which increases the input capacitance of the driver. This forces the pre-amplifying stages 116 and 118 to provide more drive (current) in order to drive the Output Driver 100. The performance of the all NMOS Output Driver 100 is poor because it is characterized by a low Drive Capability/Input Capacitance ratio.

FIG. 2 shows a BiCMOS Output Driver 200. The BiCMOS Output Driver 200 comprises a bipolar pull-up transistor 204 and an NMOS pull-down transistor 206. The Output Driver 200 has better performance than the Output Driver 100 of FIG. 1 because of bipolar pull-up transistor 204. Bipolar transistors have better Drive/Input Capacitance ratios than do MOS transistors. A problem with Output Driver 200 is that it exhibits reliability problems due to tristating. When the Output Driver 200 is tristated, the base of bipolar transistor 204 is driven low by conducting tristate transistor 227, and the gate of transistor 206 is driver low by conducting tristate transistor 228, so that the output node Qout 202 is undriven by Output Driver 200. It is to be appreciated that in a typical system node Qout 202 is also coupled to Output Drivers of other semiconductor devices. When Qout is driven high by another semiconductor device while the base of bipolar transistor 204 is driven low, a reverse bias develops on the base/emitter junction of bipolar transistor 204. Such a reverse bias can degrade the electrical characteristics of transistor 204. The changing electrical characteristics of transistor 204 makes the Output Driver 200 unreliable.

Output Driver 300 of FIG. 3 eliminates the reliability problem associated with Output Driver 200 of FIG. 2. Output Driver 300 has a diode connected bipolar transistor in series between output node bout 302 and bipolar pull-up transistor 304. Thus, when the base of bipolar transistor 304 is forced to ground during tristating, and Qout 302 is raised high by another semiconductor device, the reverse bias voltage is divided between the base emitter junctions of bipolar transistors 304 and 308. In this way each junction sustains only half the reverse bias which is not enough to degrade the electrical characteristics of transistor 304.

Unfortunately, however, the addition of bipolar transistor 308 causes the $V_{OH}$ level of Output Driver 300 to drop below specification requirements. The $V_{OH}$ level of an Output Driver is the voltage level outputted by the driver for a logical high input. For TTL level Output Drivers, $V_{OH}$ must be at least 2.4 volts. For Output Driver 300: $V_{OH}=V_{CC}-V_{bus}-V_{BE}304-V_{BE}308$ ($V_{bus}$ is the voltage drop due to resistance on the power supply bus, typically 0.2 volts for large chips; $V_{BE}$ is determined from process parameters and typically varies from 0.6 volts at high temperatures to 1.0 volts at low temperatures). Under worst case operating conditions $V_{CC}=4.4$ volts, $V_{bus}=0.2$ volts, $V_{BE}304=1$ volt, and $V_{BE}308=1$ volt. Under such conditions $V_{OH}=2.2$ volts for Output Driver 300, which is below the $V_{OH}$ minimum data sheet requirement of 2.4 volts. Thus, Output Driver 300 is unsuitable because under worst case operating conditions it does not meet minimum $V_{OH}$ specifications.

Output Driver 400 of FIG. 4 is an attempt to solve the $V_{OH}$ problem associated with Output Driver 300 of FIG. 3. Output Driver 400 includes an NMOS pull-up transistor 409 coupled in parallel with bipolar transistors 404 and 408. The NMOS transistor 409 provides a "boost" in the $V_{OH}$ level under worst case (low temperature) operating conditions so that Output Buffer 400 meets the minimum 2.4 volt $V_{OH}$ data sheet requirement. It is to be appreciated that MOS transistors exhibit their best electrical characteristics at cold temperatures due to better mobility. Thus, when temperatures are low and the $V_{BE}$ values of bipolar transistors 404 and 408 are the highest, the $V_{OH}$ level of Output Driver 400 meets minimum requirements because NMOS transistor 409 is strong at low temperatures and provides the necessary "boost" in the $V_{OH}$ level.

A problem with Output Driver 400 of FIG. 4 is that under high temperature conditions it exhibits poor performance. An Output Driver's performance can be represented by its Drive Capability/Input Capacitance. The larger the Drive/Input Capacitance ratio, the better the driver. At high temperatures MOS transistors have lower mobility, so their performance decreases. At high temperatures NMOS transistor 409 provides little assistance in pulling node Qout high, but yet still adds significant input capacitance to node 403. It is to be appreciated that the capacitive load added by NMOS transistor 409 is large because NMOS transistor 409 must be sized large enough to supply necessary current to meet the $V_{OH}$ limit during cold operating conditions. Because transistor 409 adds significant load without providing additional drive at high temperatures, the Output Driver 400 suffers a loss in performance at high temperatures. Thus, what is desired is a high performance Output Driver capable of operating reliably and consistently over a wide temperature range,

SUMMARY OF THE INVENTION

A novel, reliable, BiCMOS Output Driver which exhibits excellent performance over a wide temperature range is described. A first input supplies a logical signal to the Output Driver. A second input supplies the complimentary logical signal of the first input to the Output Driver. An output node provides an output signal from the Output Driver. A bipolar transistor and a diode connected bipolar transistor are coupled in series between $V_{CC}$ and the output node. The base of the bipolar transistor is coupled to the first input. A first NMOS transistor is coupled between the output node and ground. A second NMOS transistor is coupled between $V_{CC}$ and the output node. An inverter and a NOR gate are coupled in series between the base of the bipolar transistor and the gate of the second NMOS transistor. The input of the inverter is coupled to the base of the bipolar transistor and the output of the NOR gate is coupled to the gate of the second NMOS transistor. The NOR gate is powered by a dedicated power supply and is sized for a fast falling and slow rising output. The input of the inverter is coupled to the base of the bipolar transistor and is sized small so that it provides only a minimal capacitive load to the base of the bipolar transistor.

A goal of the present invention is to provide a reliable Output Driver which can meet $V_{OH}$ design specifications over a wide range of temperatures without sacrificing performance.

DETAILED DESCRIPTION OF THEE PRESENT INVENTION

The present invention is a novel, high-performance Output Driver capable of operating reliably over a wide temperature range. In the following description numerous specific details are set forth such as logic gates and transistor types and sizes, etc. in order to provide a thorough understanding of the present invention. However, it will be obvious to one skilled in the art that the present invention may be practiced without these specific details. In other instances, well-known circuit design principles have not been set forth in detail in order to not unnecessarily obscure the present invention.

Figure 5:
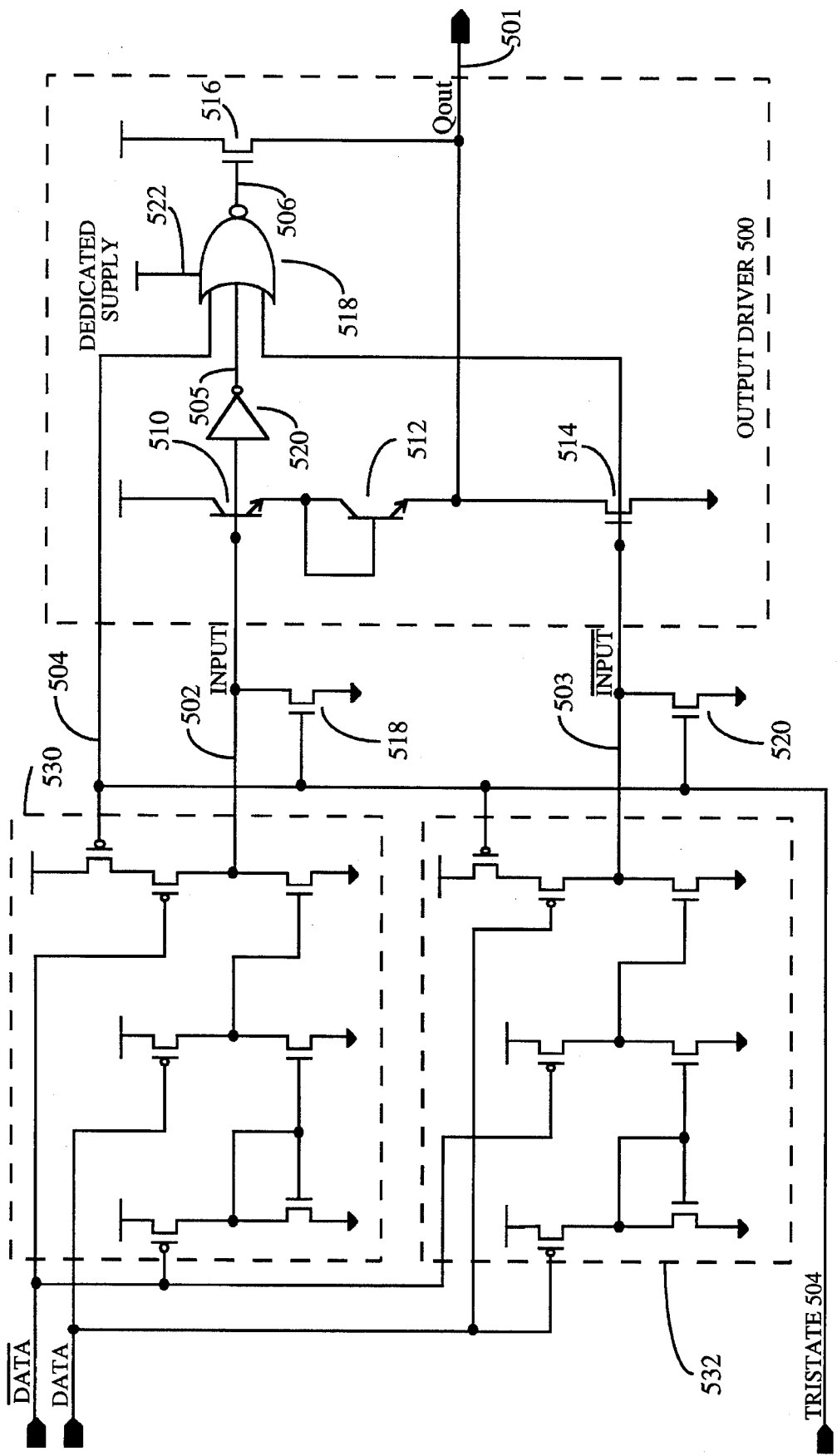
FIG. 5 is an illustration of an embodiment of the BiCMOS Output Driver of the present invention.

The present invention is a novel, high-performance, TTL-level (Transistor Transistor Logic) Output Driver 500 shown in FIG. 5. The Output Driver is typically used to drive data from one semiconductor device, such as an SRAM (Static Random Access Memory), to another semiconductor device, such as a microprocessor. The Output Driver receives a logical signal and its complement on signal lines INPUT 502 and $\overline{\text{INPUT}}$ 503, respectively. Output Driver 500 amplifies (increases the current) of the inputted signal and outputs it on node Qout 501. Output Driver 500 provides on node Qout 501 an output signal with a voltage level greater than 2.4 volts for a logical high INPUT signal and a voltage level less than 0.4 volts for a logical low INPUT signal. The Output Driver 500 of the present invention faithfully provides the desired output over a wide temperature range (i.e. from −55° C. to 125° C.) without suffering any performance loss relative to the prior art.

The Output Driver of the present invention is typically used to drive a single bit of data out from an SRAM to a microprocessor. The driver receives the data, and it's complement, in the form of INPUT and $\overline{\text{INPUT}}$ signals, respectively. In a normal implementation the Output Driver 500 receives the INPUT and $\overline{\text{INPUT}}$ signals from preamplification circuits such as 530 and 532. The preamplification circuits 530 and 532 amplify the data signal to be driven (and its compliment) so that it can drive Output Driver 500. In a typical computer system Qouts of different semiconductors would be coupled together to a single pin of a microprocessor. In this way multiple SRAMs can supply a single microprocessor with data. The Qout signals of different devices are multiplexed together so that only one semiconductor device can supply a signal to the microprocessor at any one time. While one semiconductor device is supplying data to the microprocessor, the other semiconductor devices are disabled or tristated.

The Output Driver of the present invention is shown in FIG. 5. Output Driver 500 comprises an NPN bipolar transistor 510 having its collector coupled to $V_{CC}$, typically 5 volts, its base coupled to an input node INPUT 502, and its collector coupled to a diode 512. INPUT node 502 provides the logical signal to be driven by Output Driver 500. Diode 512 is actually a bipolar transistor with its collector and base connected together. Diode 512 is coupled between the emitter of bipolar transistor 510 and output node Qout 501 of Output Driver 500. The series connection of bipolar transistor 510 and diode 512 is the primary pull-up means of Output Driver 500. An NMOS (N-channel) pull-down transistor 514 is coupled between Qout 501 and $V_{SS}$, typically ground. NMOS transistor 514 has its source coupled to $V_{SS}$ and its drain coupled to Qout 501. The gate of NMOS transistor 514 is coupled to input node $\overline{\text{INPUT}}$ 503 which supplies the opposite logical signal (or compliment) of INPUT 502 to Output Driver 500. Coupled in parallel with the series connection of bipolar transistor 510 and diode 512 is NMOS pull-up transistor 516. NMOS pull-up transistor 516 has its drain coupled to $V_{CC}$ and its source coupled to Qout 501. The gate of NMOS transistor 516 is coupled to the output 506 of a three input NOR gate 518. The first input to NOR gate 518 is input signal TRISTATE 504. TRISTATE provides a tristate signal to Output Driver 500 in order to tristate output driver 500 so that node Qout 501 is undriven. The second input to NOR gate 518 is the $\overline{\text{INPUT}}$ signal 503. And the third input to NOR gate 518 is the output 505 of inverter 520. The input of inverter 520 is the INPUT signal 502 of Output Driver 500. NOR gate 518 is powered by a dedicated power supply bus 522.

The Output Driver 500 of the present invention is a tristate Output Driver. The Output Driver 500 receives a TRISTATE signal 504 which tristates the Output Driver 500. When the TRISTATE signal 504 is high, node Qout 501 is undriven by Output Driver 500 and "floats". During tristate conditions both node INPUT and $\overline{\text{INPUT}}$ are driven low by conducting tristate transistors 518 and 520, respectively. This in turn turns off bipolar transistor 510, NMOS pull-up transistor 516, and NMOS pull-down transistor 514, leaving node Qout 501 to "float". Output Driver 500 is typically tristated while another semiconductor device which is coupled to the same pin of a microprocessor as node Qout is supplying data to the microprocessor.

Diode 512 prevents degradation of the electrical characteristics of transistor 510 when Output Driver 500 is tristated. Diode 512 prevents a large reverse-bias base emitter voltage from developing across transistor 510. Such a voltage could develop on transistor 510 if diode 512 were not present when the base of bipolar transistor 510 is driven low during tristating and Qout is driven high by another semiconductor device coupled to node Qout 501. With diode 512, however, the potential reverse-bias voltage is divided between the base emitter junction of transistor 510 and diode 512. In this way, the reverse-bias voltage across transistor 510 is not large enough to cause electrical degradation of transistor 510.

The series connection of bipolar transistor 510 and diode 512 is the primary pull-up means of Output Driver 500. When INPUT 502 is high, node Qout 501 is pulled high by transistor 510 and diode 512. The primary pull-up exhibits excellent performance characteristics under normal operating conditions. Under normal operating temperatures the primary pull-up means is almost entirely responsible for pulling the node Qout high. NMOS transistor 514 is the pull-down means of the Output Driver. When INPUT is high, NMOS transistor 514 pulls node Qout 501 low. NMOS transistor 514 is sized sufficiently large to quickly pull node Qout low.

Coupled in parallel with primary pull-up means, bipolar transistor 510 and diode 512, is NMOS transistor 516. NMOS transistor 516 provides a "boost" in the $V_{OH}$ level of Output Driver 500 under cold operating conditions so that the output can meet the minimum specified $V_{OH}$ level of 2.4 volts. It is to be appreciated that under low temperature conditions (temperatures less than 0° C.) the $V_{BE}$ values of bipolar transistors 510 and 512 can increase to approximately 1 volt, causing voltage level developed by the primary pull-up means to fall below specification. At cold temperatures, however, NMOS transistor 516 is strong due to better mobility. At low temperatures NMOS transistor 516 provides the necessary "boost" in the $V_{OH}$ level so that Output Driver 500 meets the required specifications at cold temperatures. It is to be appreciated that NMOS transistor 516 has a relatively large gate width, approximately 120 microns, in order to supply sufficient current to meet the $V_{OH}$ limit.

Figure 1:
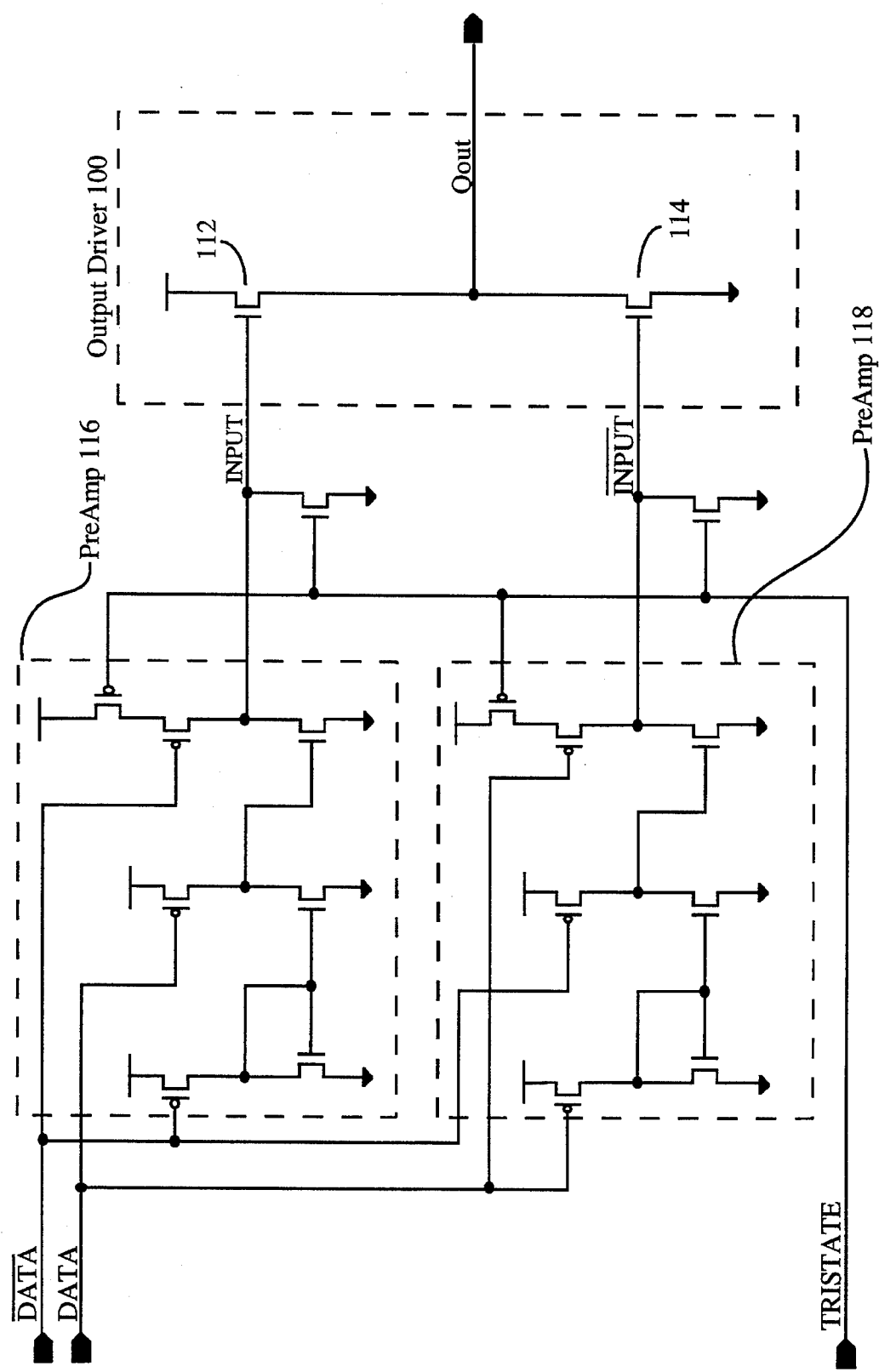
FIG. 1 is an illustration of an all NMOS Output Driver.
Figure 2:
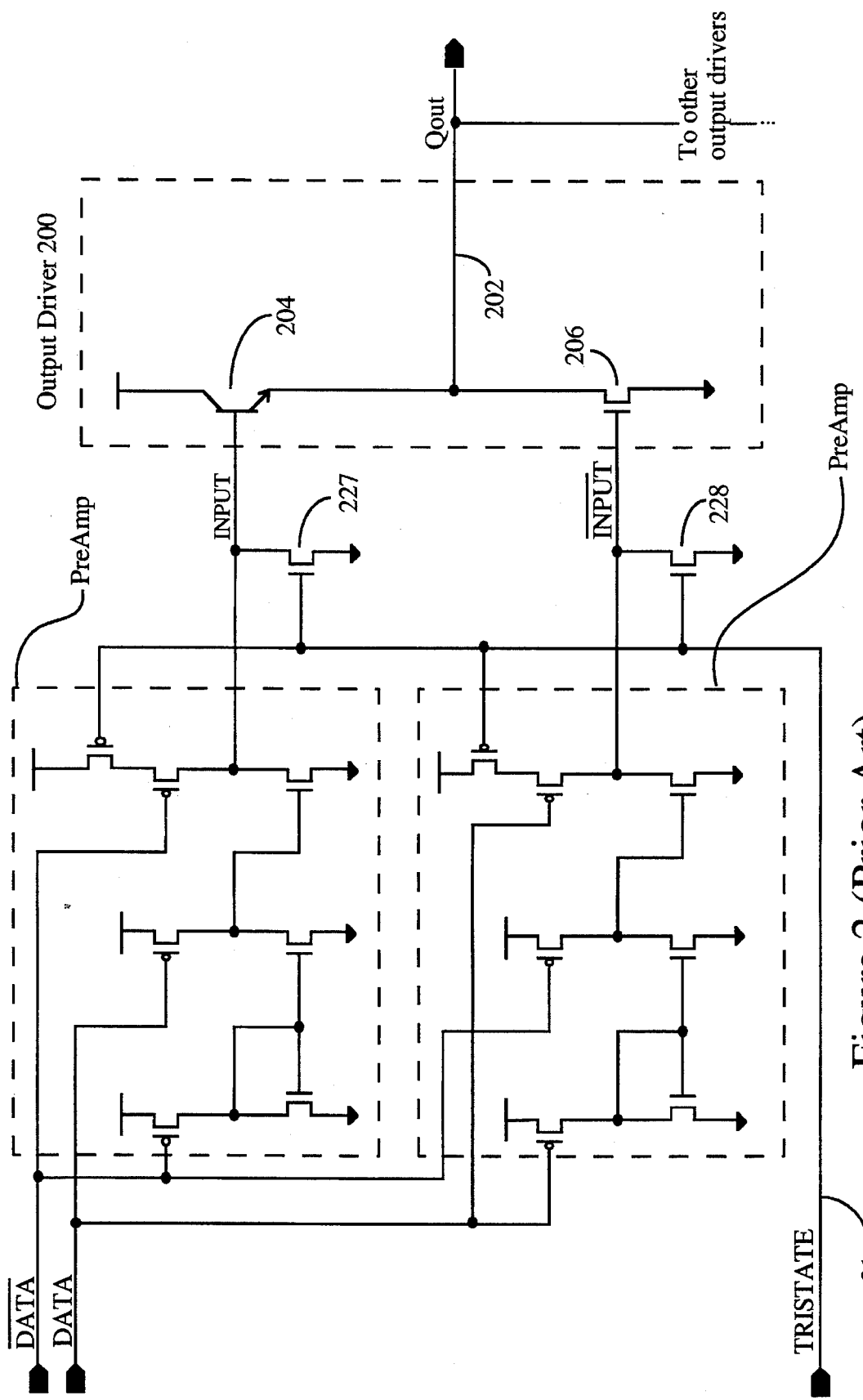
FIG. 2 is an illustration of a BiCMOS Output Driver.
Figure 3:
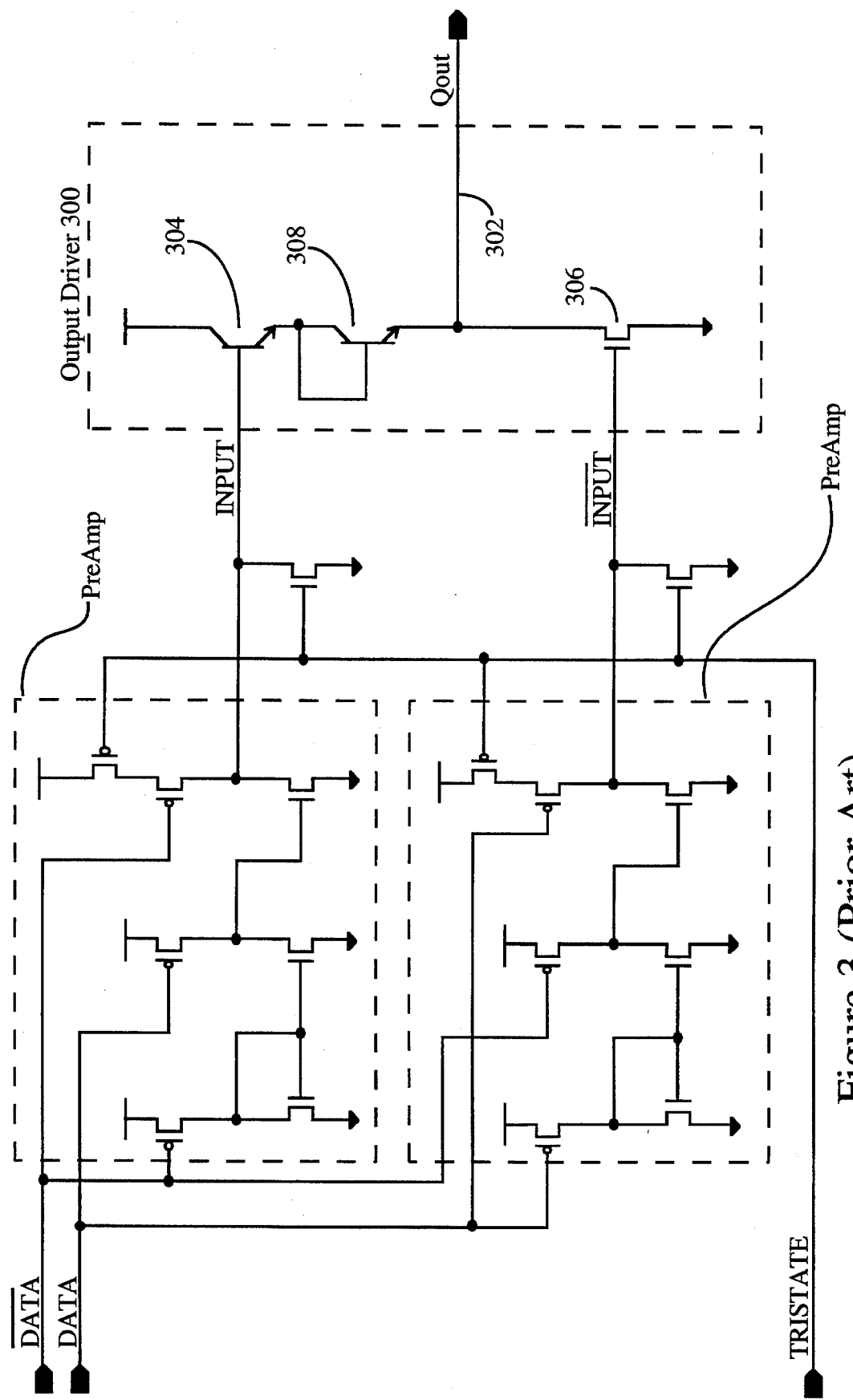
FIG. 3 is an illustration of a BiCMOS Output Driver incorporating a diode connected bipolar transistor between the output node and a bipolar transistor.
Figure 4:
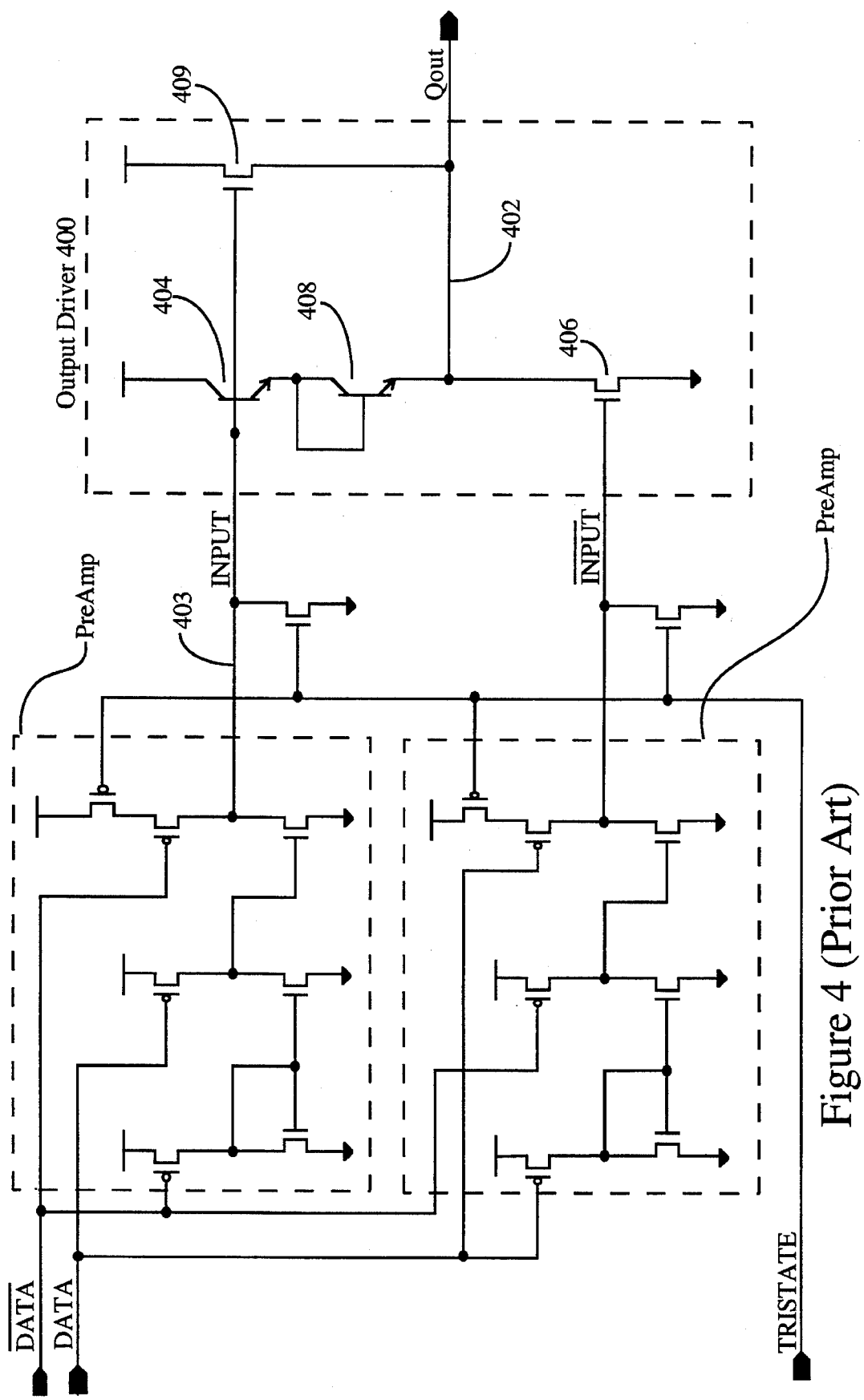
FIG. 4 is an illustration of a BiCMOS Output Driver including a NMOS pull-up transistor coupled in parallel with a series connection of a bipolar transistor and a diode connected bipolar transistor.
Figure 6B:
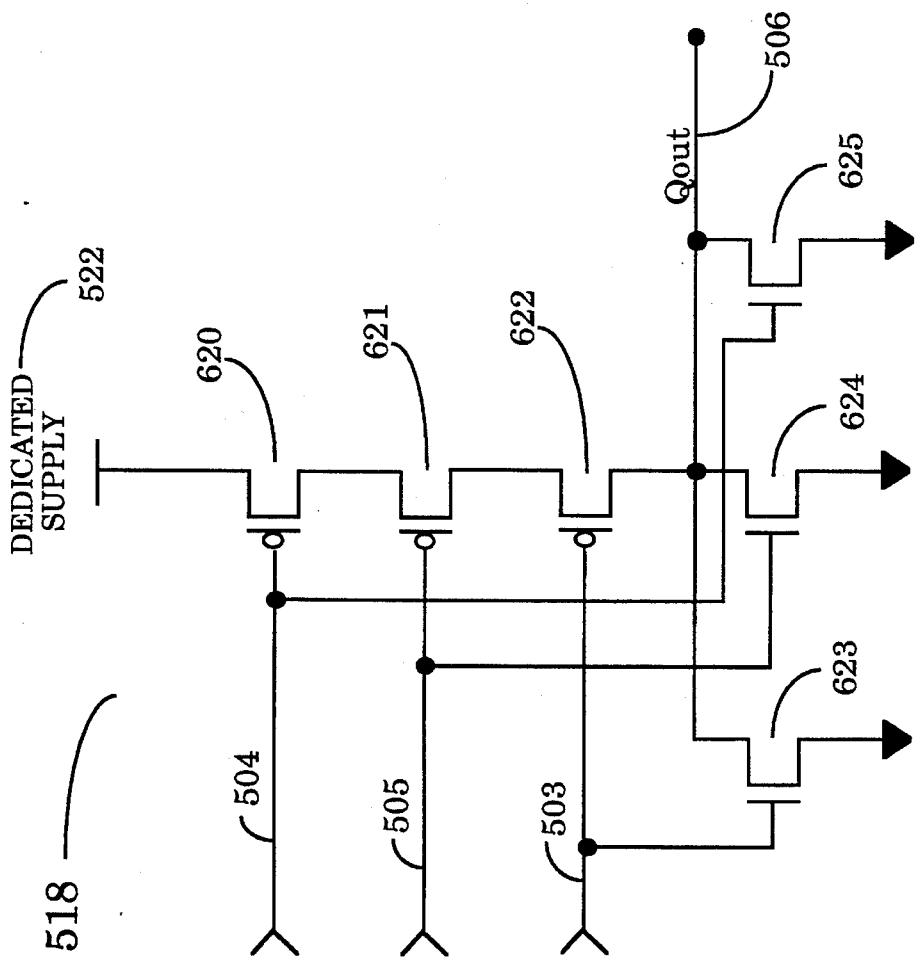
FIG. 6b is an illustration of a CMOS NOR gate which can be used in the Output Driver of the present invention.
Figure 6A:
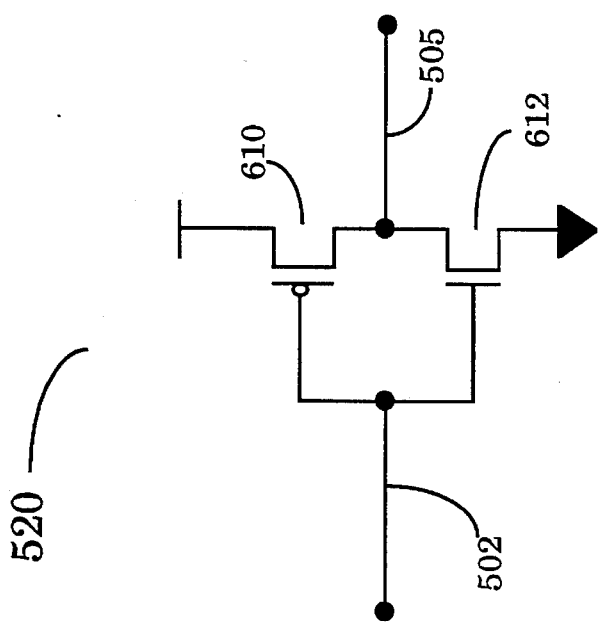
FIG. 6a is an illustration of a CMOS inverter which can be used in the Output Driver of the present invention.

Inverter 520 is provided to isolate the large load of NMOS transistor 516 from the speed-critical node INPUT coupled to the base of bipolar transistor 510. As shown in FIG. 6a inverter 520 comprises a series connection of a PMOS transistor 610 and an NMOS transistor 612. The gates of PMOS transistor 610 and NMOS transistor 612 are coupled to INPUT node 502. The source/drain coupling of transistor 612 and 610 provide the output 505 of inverter 520. The gate widths of PMOS transistor 610 and NMOS transistor 612 are relatively small, on the order of three microns. A small dimensioned inverter is utilized in the present invention so that only a small load is added to INPUT node 502. Thus, inverter 510 isolates the large capacitive load of NMOS transistor 516 from Input node 502. By isolating NMOS transistor 516 from the base of bipolar transistor 510 the performance of Output Driver 500 is not only good at low temperatures when NMOS transistor 516 is strong and helps drive Qout high, but is also good at high temperatures when NMOS transistor 16 is weak and supplies little drive. It is to be appreciated that Output Driver 400 of FIG. 4 exhibits poor performance at high temperatures because at high temperatures NMOS transistor 409 provides little drive but yet adds significant load to Input 403.

The performance of Output Driver 500 is further improved by the design of NOR gate 518. NOR gate 518 is shown in FIG. 6b. NOR gate 518 has three PMOS transistors 620, 621, and 622 coupled in series between a dedicated supply 522 and NOR gate output node 506. Three NMOS transistors, 623, 624, and 625, are coupled in parallel between NOR gate output 506 and VSS. The gates of PMOS transistor 620, 621, and 622, and the gates of NMOS transistors 625, 624 and 623, are coupled respectively to nodes 504, 505, and 503. In the present invention NMOS transistors 623, 624, and 625 have approximately twice the gate width as PMOS transistors 620, 621, and 622. Such a size ratio of PMOS transistors to NMOS transistors gives NOR gate 518 a fast falling and slow rising output.

NOR gate 518 is designed to quickly turn off and to slowly turn on NMOS transistor 516. NMOS transistor 516 does not significantly help in driving Qout 501 high above the TTL level midpoint of 1.5 volts. It is, therefore, not important to quickly turn on NMOS transistor 516. It is, however, important to quickly turn off transistor 516 when Qout is to be switched low. It is important to turn off NMOS transistor 516 quickly so that no current can flow from $V_{CC}$ through transistor 516 and transistor 514 to ground. Such a flow of current can cause serious damage to the Output Driver 500. NOR gate 518 is therefore sized to facilitate the fast turn off and the slow turn on of transistor 516. By only having to slowly turn on NMOS transistor 516, the P type transistors of NOR gate 518 can be kept small, and thereby decrease the loads seen by INPUT and TRISTATE.

Another valuable feature of Output Driver 500 is that NOR gate 518 is coupled to a dedicated power supply. The dedicated power supply 522 is isolated at the power supply pad from the main power supply bus of the chip. The dedicated supply 522 is a separate power supply bus which is taken directly from the bond pad. The dedicated supply 522 provides power only to NOR gate 518 and to similar NOR gates of other Output Drivers on chip. Typically a semiconductor chip such as an SRAM has a single main power supply bus which is routed around the entire chip to supply the chip with power. Since the main supply bus carries all the current (75–125 milliamps) of the chip, it experiences a significant voltage drop due to the resistance of the bus. This voltage drop can be as much as 0.2 volts. Because the dedicated power supply 522 of the present invention connects only to the NOR gates of each of the Output Drivers on chip, and because NOR gate 518 is a CMOS gate driving only a capacitive load, there is no steady state current and therefore no voltage drop on the dedicated supply bus 522. With no voltage drop on the dedicated supply 522, the gate of NMOS transistor 516 can receive the full operating voltage level. A higher gate voltage on NMOS transistor 516 increases the $V_{OH}$ level of Output Driver 500 which improves the reliability and performance of Output Driver 500.

Figure 7:
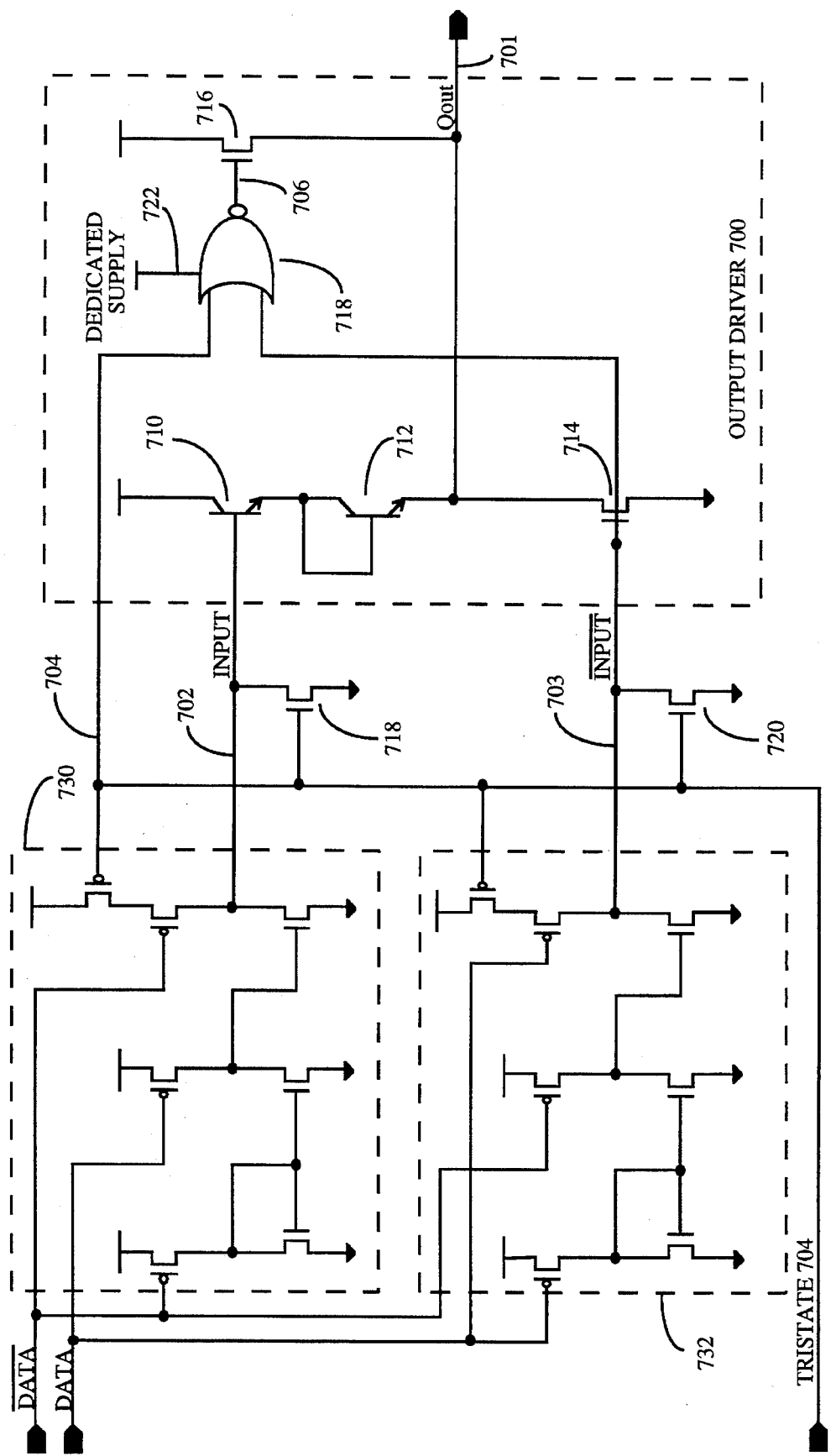
FIG. 7 is the preferred embodiment of the BiCMOS Output Driver of the present invention.

An alternative and presently preferred embodiment of the present invention is shown in FIG. 7. The Output Driver 700 is similar to the Output Driver 500 except that it includes a 2-input NOR gate 718 instead of a 3-input NOR gate 518. One input of the 2-input NOR gate 718 is coupled to TRISTATE 704 and the other input is coupled to INPUT 703. In this way, the base of bipolar transistor 710 sees no additional load from circuitry used to turn NMOS transistor 716 on and off. The gate of NMOS pull-up transistor 716 is completely isolated from speed critical node INPUT 702. It is to be appreciated that although inverter 520 of Output Driver 500 is sized small, it still loads the base of bipolar transistor 510.

Two-input NOR gate 718 is coupled to a dedicated supply 722. Dedicated supply 722 insures that the gate of NMOS pull-up transistor 716 receives a full voltage level which increases the $V_{OH}$ level of Output Driver 700. Additionally, NOR gate 718 is sized for a fast falling and slow rising output. In this way NMOS pull-up transistor 716 is turned on slowly and turned off quickly. Such a sizing of NOR gate 718 improves the performance of Output Driver 700.

Figure 8:
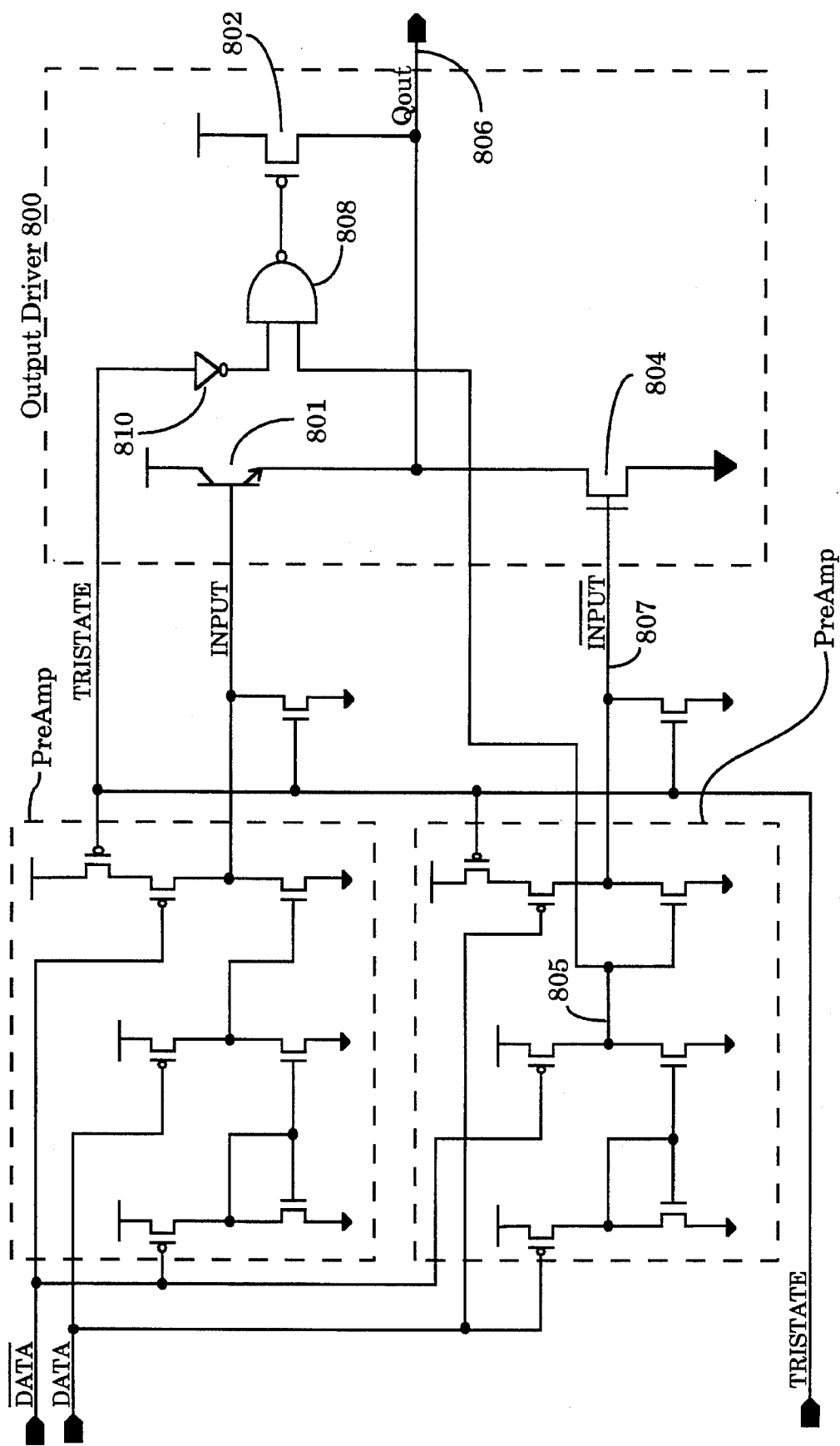
FIG. 8 is an alternative embodiment of the BiCMOS Output Driver of the present invention.

An alternative embodiment of the Output Driver of the present invention is shown in FIG. 8. Output Driver 800 is ideally suited for low voltage ($V_{CC}$=3.3 volts) applications. Output Driver 800 is similar to Output Driver 500 except that it utilizes a PMOS (P channel) pull-up transistor 802 instead of an NMOS transistor 60. PMOS transistor 806 makes Output Driver 800 ideal for use in low voltage integrated circuits. The voltage drop across a conducting PMOS transistor is less than the voltage drop across a conducting NMOS transistor. This translates into a higher $V_{OH}$ level for Output Driver 800 as compared to Output Driver 500. It is to be appreciated that with a 3.3 volt power supply ($V_{CC}$) there is less than a 1 volt window to meet minimum $V_{OH}$ specification of 2.4 volts.

NAND gate 808 is sized for a fast rising and a slow falling output. This design facilitates a fast turn-off and a slow turn-on of PMOS transistor 802. Sizing NAND gate 808 for a slow turn-on of transistor 806 improves the performance of the Output Driver 800.

One input to NAND gate 808 is an inverted TRISTATE signal from inverter 810. The second input 805 is a signal corresponding to the logical state of the signal to be outputted. It is noted that node 805 is upstream of node 807 which drives the gate of NMOS pull-down transistor 807. In this way, transistor 802 can be turned off before transistor 804 is turned on to pull low node Qout 806. It is to be appreciated that in Output Driver 800 the gate of PMOS transistor 802 is electrically isolated from the base of bipolar transistor 801. That is, the large capacitive load of PMOS transistor 802 is isolated from the INPUT. By isolating the gate of PMOS transistor 802 from the base of the bipolar transistor 801, Output Driver 800 exhibits good performance at high temperatures as well as at low temperatures.

It is to be appreciated that although the present invention has been described with respect to specific circuits and specific uses of these circuits, the teachings of the present invention are not intended to be limited to these specific circuits or implementations. It is to be expected that one skilled in the art may easily change logic gates, transistor types and sizes, etc. and still practice the teachings of the present invention.

Thus, a novel, reliable, BiCMOS Output Driver has been described which exhibits excellent performance characteristics over a wide temperature range.

I claim:

1. A BiCMOS Output Driver comprising:

an input node;

an output node;

a bipolar transistor and a diode coupled in series between a first operating potential and said output node, the base of said bipolar transistor coupled to said input node;

a MOS transistor coupled between said first operating potential and said output node; and an isolation circuit turning on said MOS transistor when said input node is high and turning off said MOS transistor when said input node is low wherein said isolation circuit has an input capacitance significantly less than said MOS transistor, said isolation circuit having at least one logic device coupled between the gate of said MOS transistor and the base of said bipolar transistor.

2. The Output Driver of claim 1 wherein said isolation circuit comprises an inverter coupled to the base of said bipolar transistor, said inverter comprising: a PMOS transistor and a NMOS transistor wherein said PMOS transistor and said NMOS transistor each have a channel length significantly less than the channel length of said MOS transistor.

3. An Output Driver comprising:

an input node;

an output node;

a first pull-up circuit comprising a bipolar transistor for pulling high said output node, said first pull-up circuit coupled between said output node and a first operating potential, the base of said bipolar transistor coupled to said input node;

a pull-down circuit for pulling low said output node said pull down circuit coupled between said output node and a second operating potential;

a second pull-up circuit coupled in parallel with said first pull-up circuit for assisting said first pull-up circuit with pulling high said output node, said second pull-up circuit comprising a MOS transistor; and a circuit coupled to the gate of said MOS transistor, said circuit slowly turning on and quickly turning off said MOS transistor.

4. The Output Driver of claim 3 wherein said first pull-up circuit further comprises a diode coupled between said output node and said bipolar transistor.

5. An Output Driver comprising:

an input node;

an output node;

a first pull-up circuit comprising a bipolar transistor for pulling high said output node, said first pull-up circuit coupled between said output node and a first operating potential, the base of said bipolar transistor coupled to said input node;

a pull-down circuit for pulling low said output node said pull down circuit coupled between said output node and a second operating potential;

a second pull-up circuit coupled in parallel with said first pull-up circuit for assisting said first pull-up circuit with pulling high said output node, said second pull-up circuit comprising a MOS transistor; and a circuit coupled to the gate of said MOS transistor, said circuit turning on and turning off said MOS transistor, wherein said circuit is coupled to a dedicated power supply.

6. An Output Driver comprising:

an input node;

an output node;

a first pull-up circuit comprising a bipolar transistor for pulling high said output node, said first pull-up circuit coupled between said output node and a first operating potential, the base of said bipolar transistor coupled to said input node;

a pull-down circuit for pulling low said output node said pull down circuit coupled between said output node arid a second operating potential;

a second pull-up circuit coupled in parallel with said first pull-up circuit for assisting said first pull-up circuit with pulling high said output node, said second pull-up circuit comprising a MOS transistor; and a circuit coupled between the gate of said MOS transistor and the base of said bipolar transistor, said circuit comprising:

an inverter; and a NOR gate, said inverter coupled between the base of said bipolar transistor and said NOR gate, said NOR gate coupled between said inverter and the gate of said MOS transistor, said circuit capable of turning on and turning off said MOS transistor.

7. An Output Driver comprising:

an input node;

an output node;

a first pull-up circuit comprising a bipolar transistor for pulling high said output node, said first pull-up circuit coupled between said output node and a first operating potential, the base of said bipolar transistor coupled to said input node;

a pull-down circuit for pulling low said output node said pull down circuit coupled between said output node and a second operating potential;

a second pull-up circuit coupled in parallel with said first pull-up circuit for assisting said first pull-up circuit with pulling high said output node, said second pull-up circuit comprising an PMOS transistor; and a circuit coupled to the gate of said PMOS transistor, said circuit capable of turning on and turning off said PMOS transistor, said circuit electrically isolated from the base of said bipolar transistor.

8. The output driver of claim 7 further comprising a diode coupled between bipolar transistor and said output node.

9. The output driver of claim 7 wherein circuit has a fast rising and a slow falling output.

10. The output driver of claim 7 wherein said circuit comprises a NAND gate coupled to the gate of said PMOS transistor.

11. The output driver of 10 further comprising:

a tristate input; and an invertor wherein said inverter is coupled between said tristate input and said NAND gate.

* * * * *